(12) United States Patent
Forlenza et al.

(10) Patent No.: US 7,574,644 B2
(45) Date of Patent: Aug. 11, 2009

(54) FUNCTIONAL PATTERN LOGIC DIAGNOSTIC METHOD

(75) Inventors: Donato Forlenza, Hopewell Junction, NY (US); Franco Molika, Hopewell Junction, NY (US); Phillip J. Nigh, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/166,019

(22) Filed: Jun. 25, 2005

(65) Prior Publication Data

US 2005/0289426 A1 Dec. 29, 2005

Related U.S. Application Data

(62) Division of application No. 10/064,398, filed on Jul. 10, 2002, now Pat. No. 7,017,095.

(51) Int. Cl.
*G06F 11/00* (2006.01)
(52) U.S. Cl. ............................ 714/736; 714/21; 714/25; 714/37; 714/45; 714/48; 714/723; 714/724; 714/726; 714/727; 714/729; 714/732; 714/735; 714/738; 714/742
(58) Field of Classification Search ........................ None
See application file for complete search history.

(56) References Cited

U.S. PATENT DOCUMENTS

| | | | | |
|---|---|---|---|---|
| 5,396,170 | A * | 3/1995 | D'Souza et al. | 324/158.1 |
| 5,663,967 | A * | 9/1997 | Lindberg et al. | 714/737 |
| 5,907,562 | A * | 5/1999 | Wrape et al. | 714/726 |
| 6,725,406 | B2 * | 4/2004 | Kakizawa et al. | 714/727 |

* cited by examiner

*Primary Examiner*—John P Trimmings
(74) *Attorney, Agent, or Firm*—Michael J. LeStrange

(57) ABSTRACT

A method of diagnosing semiconductor device functional testing failures by combining deterministic and functional testing to create a new test pattern based on functional failure by determining the location of the type of error in the failing circuit. This is accomplished by identifying the failing vector during the functional test, observing the states of the failed device by unloading the values of the latches from the LSSD scan chain before the failing vector, generating a LOAD from the unloaded states of the latches, applying the generated LOAD as the first event of a newly created independent LSSD deterministic pattern, applying the primary inputs and Clocks that produced the failure to a correctly operating device, unloading the output of the correctly operating device to generate a deterministic LSSD pattern; and applying the generated deterministic LSSD pattern to the failing device to diagnose the failure using existing LSSD deterministic tools.

5 Claims, 3 Drawing Sheets

FUNCTIONAL PATTERN LOGIC DIAGNOSTIC METHOD

This is a division of application Ser. No. 10/064,398 filed Jul. 10, 2002, now U.S. Pat. No. 7,017,095.

BACKGROUND OF THE INVENTION

1. Field of the Invention

This invention relates generally to a method of diagnosing complex semiconductor devices utilizing logic circuits that have failed functional testing. More particularly this invention diagnoses and determines the failing locations by combining functional testing of the device circuitry with structural design and test techniques to dynamically create a new test pattern based on the functional failure and thereby determine the location of and type of error in the failing circuit.

2. Background of the Invention

Level Sensitive Scan Design (LSSD) methodology is well known to the prior art. Basically the LSSD methodology is a system design in which the device under test has a plurality of storage elements, i.e., latches or registers, that are concatenated in one or more scan chains and are externally accessible via one or more serial inputs and outputs. Storage elements that are not so concatenated are usually memory or other special macros that are isolated and can be tested independently. This LSSD methodology ensures that all logic feedback paths are gated by one or more of these concatenated storage elements, thereby simplifying a sequential design into subsets of combinational logic sections.

These basic design concepts, in conjunction with the associated system and scan clocking sequences, greatly simplify the test generation, testing, and the ability of diagnosing very complex logic structures. In such a design every latch can be used as a pseudo Primary Input (PI) and as a pseudo Primary Output (PO), in addition to the standard Primary Inputs and standard Primary Outputs, to enhance the stimulation and observability of the device being tested or diagnosed. Typically LSSD latches are implemented in a configuration having master (L1) and slave (L2) latches where each master latch (L1) has two data ports and may be updated be either a scan clock or a functional clock and each slave latch (L2) has but one clock input that is out of phase with both L1 scan and functional clocks. Scanning is done using separate A and B scan clocks.

The strategy of diagnosing these LSSD circuits has been established and evolving for many years. The primary characteristic of deterministic or pre-determined LSSD patterns is that each pattern is independent from every other pattern and each pattern consists of Primary Inputs, Clocks, a Load, and an Unload sequence. Such LSSD circuits may have thousands of patterns depending upon the size and structure of the logic. During diagnostics, one or more failing patterns are identified and fault simulation is performed on the failing pattern (Load, Primary Inputs, System Clocks, and Unload sequence). The circuit states can be quickly achieved by reviewing and simulating the falling pattern load, any Primary Inputs, System Clocks, and measures. Passing patterns may also be used to eliminate potential faults that the identified failing patterns marked as potential candidates.

However this method of diagnosing of such complex logic structures to determine the devices that have failed functional testing is very time consuming and difficult and is even more difficult when the circuit designs are sequential in nature and utilize a functional pattern test methodology as found in LSSD circuits. General Scan Designs (GSD) circuits are similar and well known to the art.

The testing and diagnosis of such complex circuits (LSSD and GSD) can be greatly simplified by adopting a design-for-test methodology that reduces the sequential circuit in partitions of combinational logic and allows access to the storage elements within the circuit during the testing process. This structural test methodology in conjunction with such scan based designs allows for effective functional and structural testing approaches.

Both, functional and structural logic test methodologies have unique advantages. Structural logic testing benefits include, ease of test pattern generation, simpler diagnostic methods, lower test pattern data volumes, specific fault targeting, high test coverage and precise test effectiveness measurement. Alternatively, functional testing can be applied at-speed, tests the actual device application functions, and closely emulates the operating environment during test. However, functional testing is sequential in nature and thus must rely on previous events or states of the logic for each subsequent pattern.

Functional fails are generally very difficult to diagnose since detail understanding of the logic circuit design and functional fail behavior is necessary and using the prior art techniques requires that test engineers and designers dedicate many hours and several diagnostic iterations to understand and diagnose the failure mechanism.

This basic problem complicates the diagnostic process by the need to track the structure's logical states for several previous events. This is required so that the failing vector can be analyzed with the proper values of each logic circuit at the time and point of failure.

Therefore, there are compelling economic reasons to electrically diagnose any fault in the circuit to within a couple of logic blocks or a dozen or so transistor devices as rapidly as possible.

It is also desirable that the diagnostic process between the electrical model and the physical location be correlated by providing conventional PFA tools with an precise physical location for the potential defect.

SUMMARY OF THE INVENTION

The present invention is directed to a method of diagnosing failing circuits encountered during functional testing of complex LSSD or GSD circuits and for diagnosing the failure mode of those devices which have failed to pass by combining deterministic and functional testing and diagnostic techniques.

Another object of the present invention is to allow for a systematic diagnostic methodology based on design structure rather than functional behavior, thereby reducing turn-around-time and fault localization accuracy and resolution.

Still another object of the present invention is to test and diagnose partial scan designs.

The present invention especially accomplishes this by transforming a functional pattern into a scan deterministic pattern so that existing diagnostic tools can also be used without impacting manufacturing test.

Broadly the present invention comprises a method of testing that includes the steps; of identifying the failing vector of the functional test; observing the states of the failed device by unloading the values of the latches from the LSSD scan chain before the failing vector which may also include reading the embedded circuit memories and other circuit storage elements; generating a Load from the unloaded states of the latches: applying the generated Load which as the first event of a newly created independent LSSD deterministic pattern using the same identical primary inputs and Clocks that produced the failure to known correctly operating device using the bootstrapping technique and unloading the output of the correctly operating device to generate a deterministic LSSD pattern; and operating the generated deterministic LSSD pattern to the failing device and diagnosing the failure using existing LSSD deterministic tools.

The testing protocol is designed to determine whether any of the internal functional circuit elements in a complex solid state device is stuck at zero or stuck at one or have AC faults, i.e.,transitional faults. Testing speed is adjusted such that all circuit elements have sufficient time to obtain their respective stable states.

The devices to be tested and the testing protocol itself obey strict predetermined rules of binary logic. Thus, the output response of a device under test can at all times in the test cycle be predicted in advance as a function of the history of applied input stimuli. The word "history" has been chosen to denote that many logic devices produce outputs which are a function of both combinational and sequential logic.

As taught by the present invention, the generic diagnostic process described above can be applied in several partial or hybrid steps. One approach is to only utilize the observability access of the scan design to aid in the diagnosis after a predetermined set of functional vectors have been applied thus allowing functional patterns to run at speed until the failing point is reached and then unload the state of the machine and isolate the fault.

Another approach, one could use the scan access to stimulate or initialize the internal state of the logic prior to applying the functional patterns allowing narrowing down the partition of the functional patterns surfacing the faulty logic. By combining these hybrid steps and iteratively executing multiple partitions, the present invention can ultimately yield one or more independent scan test vectors that can be used in the generic diagnostic process.

As previously noted, functional fails are generally very difficult and time consuming to diagnose. The present invention avoids these difficulties by generating structural LSSD test patterns that will induce a failure mechanism that behaves in a similar failing manner.

These objects, features and advantages of the present invention will become further apparent to those skilled in the art from the following detailed description taken in conjunction with the accompanying drawings wherein:

DESCRIPTION OF THE PREFERRED EMBODIMENT

Figure 1:
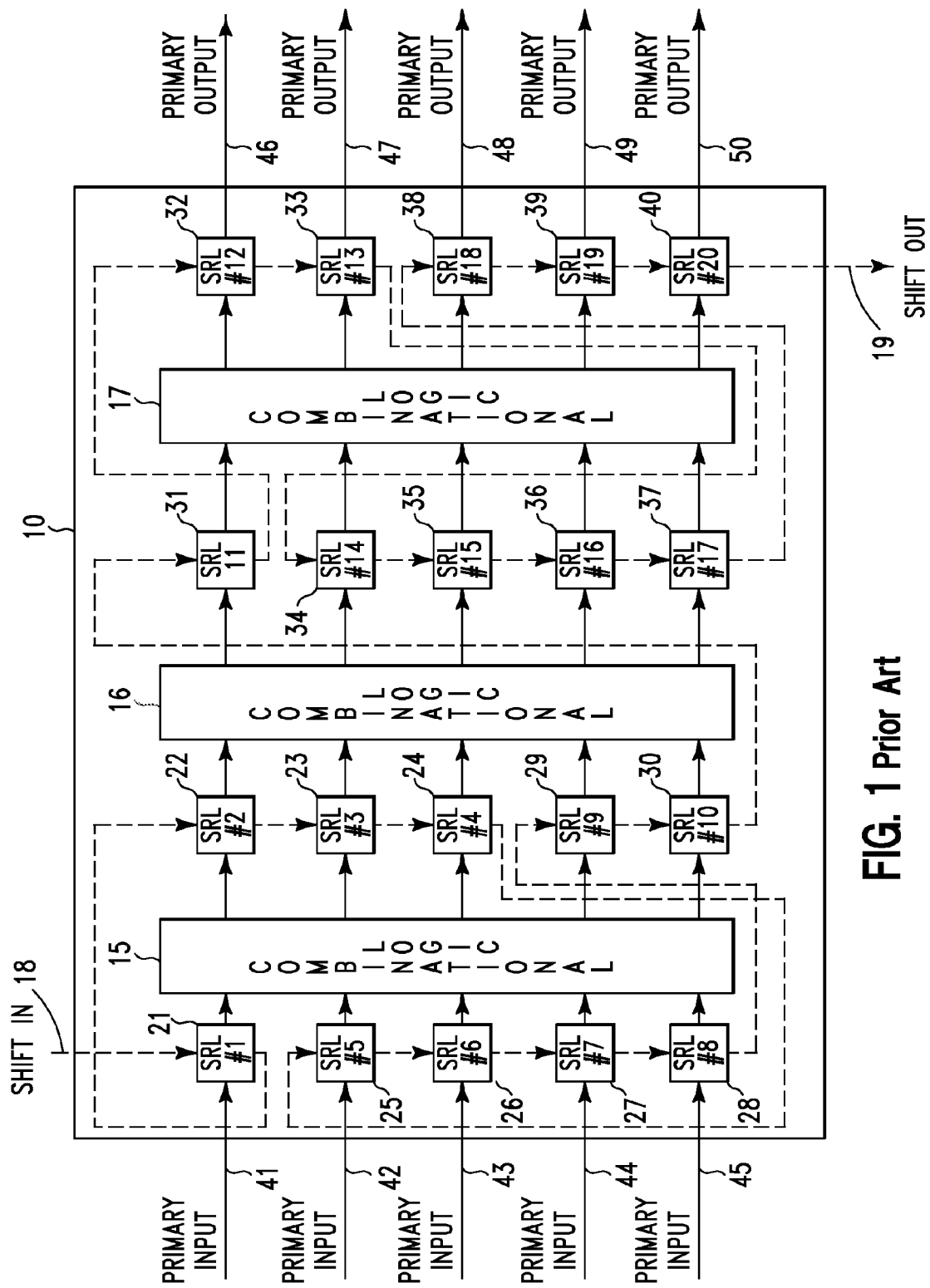
FIG. 1 illustrates a typical prior art digital logic chip having a linear distribution of primary input and primary output signal lines along the shift register scan string.
Figure 2:
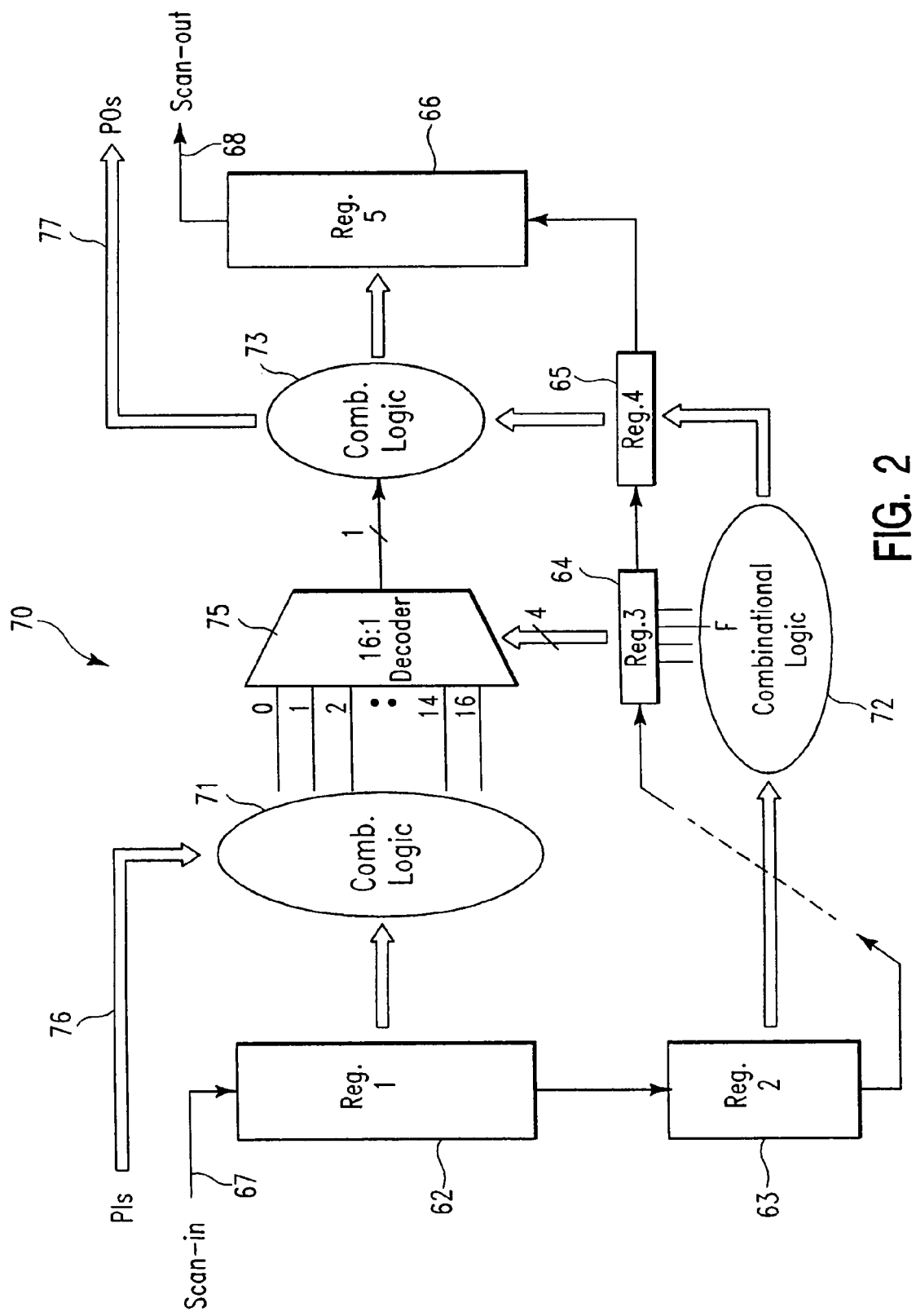
FIG. 2 schematically illustrates the interaction between a selected number of shift register latches and the combinational logic of a logic chip having a failure therein.
Figure 3:
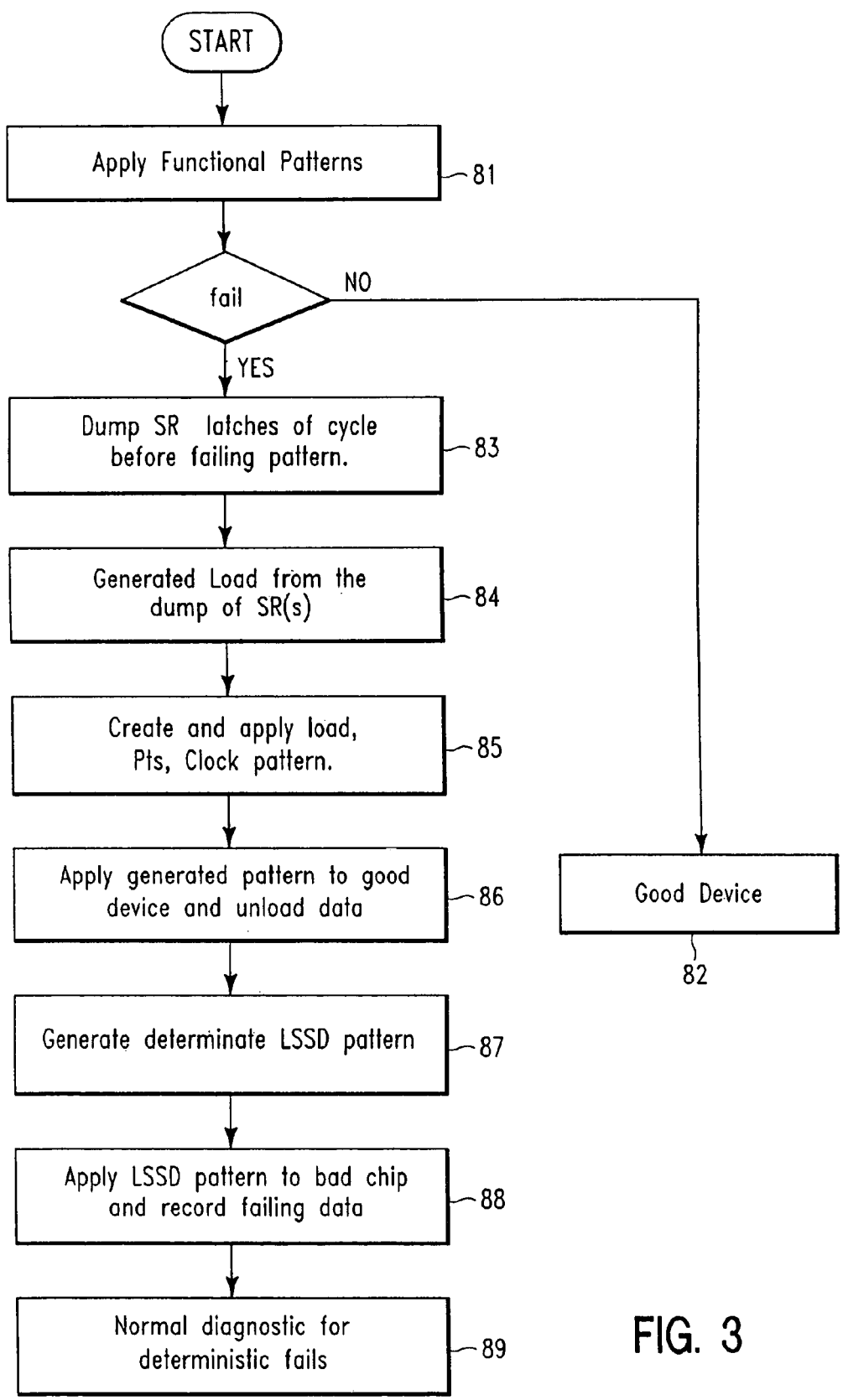
FIG. 3 is a flow chart illustrating the steps of the present invention.

These and other features and advantages of the present invention will become more readily apparent from the following detailed description thereof, when read with reference to the accompanying drawings wherein FIG. 1 illustrates a typical digital logic chip having a linear distribution of primary input and primary output signal lines along the shift register scan string; FIG. 2 schematically illustrates the interaction between a selected number of shift register latches and the combinational logic of a logic chip having a failure therein tested and FIG. 3 is a flow chart illustrating the steps of the present invention.

FIG. 1 illustrates a typical digital logic chip 10 including combinational logic and a shift register scan string coupled between a SHIFT IN line 18, a SHIFT OUT line 19 and individual shift register latches 21 through 40. As is well known to the art, such combinational logic is comprised of a plurality of interconnected digital logic circuits and the activation of any particular ones of these digital logic circuits and the manner of their interconnection is determined by the input information, i.e., the Scan In data and the Primary Inputs. Thus any digital logic circuit including embedded sequential logic can be so used. Further, by selecting appropriate timing and input signals, as known to the prior art, the shift register latches 20 through 40 are configurable to operate either in the form of a single, long shift register or as intermediate data storage buffers between portions of the combinational logic. It should be understood that the combinational logic is always being essentially reconfigured during operation. Thus, for ease of description of operation of the chip, the combinational logic 11 is shown in this FIG. 1 as individual blocks 15, 16 and 17.

Additionally, certain shift register latches are also operable to receive primary input signals and to temporarily store primary output signals. As shown in FIG. 1, the shift register latches in the scan string are also capable of effectively operating as chip or system input and output buffers or receiving latches. Primary inputs are introduced into the chip 10 via signal lines 41 to 45 coupled into a bus 60 and outputs are removed from the chip via primary output signal lines 46 to 50 coupled in a bus 61. It should also be appreciated that the shift register latches 21 to 40 typically are of a dual latch design as will be later described in conjunction with FIG. 3.

During normal operation of the chip 10, the primary input lines 41 to 45 supply signals are fed directly to the first five shift register latches 21, 25, 26, 27 and 28 and thence to combinational logic block 15 whose output signals are supplied directly to the following set of five shift register latches 22, 23, 24, 25 and 30. In turn, the signals from these latches 22, 23, 24, 25 and 30 also flow to combinational logic block 16. In this mode the shift register latches are not operating as part of a shift register but rather are operating in a parallel fashion so as to accept primary input signals and to pass output signals from one combinational logic block to the next. Ultimately, the output signals from the last combinational logic block 17 are supplied through the five shift register latches 32, 33, 38, 39 and 40 to the primary output signal lines 46, 47, 48, 49 and 50. It should be also understood that, in typical situations, there may be as many as a thousand or more shift register latches in any one scan string and correspondingly there are also many more separate combinational logic blocks employed.

During test operations, normal system clocks are used to capture test responses in the shift register latches. Also in this mode of operation, desired test signals or stimuli are supplied from the "SHIFT IN" line 18 and desired test responses are ultimately supplied on the "SHIFT OUT" line 19. During test operations, the latches 21 through 40 are configured in a long shift register configuration, in accordance with LSSD methodology. Such tests are necessary, for if there is a problem with any of the shift register latches in the chain, the test function is impaired as is also the potential functioning of the chip or system 10 by virtue of the fact that signal communication between the combination logic blocks is impaired.

The present invention thus provides an easy way of detecting faults in an LSSD scan string.

Referring to both FIG. 2 and FIG. 3, the diagnostic technique of the present invention will now be discussed in detail.

FIG. 2 schematically illustrates the interaction between a selected number of shift register latches and the combinational logic of a logic chip having a failure therein and FIG. 3 shows a flow chart illustrating the method of the present invention. In FIG. 2 there is schematically illustrated a portion of a logic chip, designed according to LSSD rules, having five individual, dual action latch design, shift registers 62, 63, 64, 65 and 66 of varying lengths concatenated in a single scan chain that is serially coupled between a Scan-in line 67 and a Scan-out line 68. These shift registers 62, 63, 64, 65 and 66 are further coupled to various portions 71, 72, and 73 of a combinational logic block 70 containing a 16:1 decoder 75. A Primary Input line 76 and a Primary output line 77 is also coupled to the combinational logic block 70. As noted previously, in these logic chips, the devices making up the combinational logic block 70 are all interconnected and the activation of any portion or portions thereof and routing of the data there through is established by the input information, i.e., the Scan-in data and the Primary Inputs, being passed through the registers and logic as a series of functional patterns applied from any suitable presently available prior art tester (not shown), in a manner known to the prior art.

In such a functional test, data in the form of a functional test pattern is fed into the chip under test via the primary line input 76. Each respective functional test pattern is comprised of input clocking signals and data signals which are entered into each respective primary input from whence it passes to the latches, forming the combinational logic 70, until it reaches a selected Primary Output line 77 where it is recorded. Each functional pattern applies input data to each Primary Input node of the chip via the Primary Input line 76 simultaneously with a clock signal pulse being applied via the Scan-in line 67 to selectively operate the latches in the combinational logic 70 in known combinations and is shown in FIG. 3 as step 81.

If, at the end of the test, all the signals received at the output nodes are identical to the desired or expected signal, e.g., a "1" or a "0" the tested device or chip did not fail and is rated good and, as shown in FIG. 2, (Step 82) no further testing is required.

However, because such complex integrated circuit devices contain thousands of latches that may be combined into many thousands of complex interconnections and combinational interdependencies, the time need for testing for device failures increases as the number of circuit elements increases. For example, if a semiconductor chip has fifty primary input connections, the number of combinations of inputs can easily be 230 and this figure can become compounded by the number of possible logical paths through the various latches in the combinational logic. While present testers can apply that number of different input patterns, record the output responses, and compare those responses with the responses that ought to result, generally they still cannot identify the failure as being a result of a fault occurring in any particular latch or combinational path.

While a particular defective latch or logic path may not be repairable, it useful to identify the failing latch or logic path and to diagnose its failure mode for not only can it lead to improved production and process controls but may also permit the manufacturer to apply factors that would avoid any need of using the defective latch or logic path.

Accordingly, the present invention is designed to readily and quickly locate and identify such a failing latch or logic combination. The process of the present invention accomplishes this result and will now be described with reference to both FIG. 2 and FIG. 3.

For this description, the circuit shown in FIG. 2 and described above will be used.

It is to be assumed that the circuit is designed according to LSSD rules and has all the registers concatenated into a single scan chain accessed via the scan-in and scan-out I/Os.

It is to be further noted that, for the purpose of this example, the combinational logic block 72, that controls the four select lines of the decoder via Reg. 3, contains a fault F and that this fault F will during functional testing produce an erroneous result that eventually propagates, from one of these faulty select lines, to some Primary Outputs and register latches. Once this erroneous result is noted at the Primary Outputs, the device is identified as faulty, and the diagnostic process of the present invention is initiated to localize the fault F.

The expected output of any cycle can be established either by any one of a number of prior art software simulation techniques or by passing the functional signals through a chip that is known to be good, i.e. the so called "bootstrapping approach".

If a known good or 'golden' chip is available this "bootstrapping approach", is usually the quickest, easiest and simplest technique to use. In this "bootstrapping approach", the shift register load, the primary input stimuli and clocking sequence are combined into a structural LSSD tester loop and the pattern is applied to the known good device under the same conditions as induced the failure in the chip being tested. The primary output of the good device, at all cycles, is now recorded, as good or expected data, the scan chain of the good device is unloaded and the control data of all the latches in the good device is also recorded. This data can now be used as the expected data for use in determining if any particular device fails.

Thus when a primary output provides an output signal different than expected, e.g., a "0" was received when a "1" was expected or a "1" was received when a "0" was expected it denotes that a failure has been encountered and it becomes necessary to identify the failing latch or logic combinational path in order to analyze the defect or Fault F. Other failures such as AC faults or transitional failures also occur and can be identified and analyzed by using the present invention It will be assumed, for purposes of illustration only, that during the test a failure is detected at a Primary Output at a Cycle Z. The term Cycle is herein defined as any specified event or series of events that occur within a specific functional test pattern, i.e., a set or sequence of input signals. The letter designation following the term Cycle is merely to identify a specific point in the output sequence created by the application of the test pattern sequence. An error detected at the output is but one such event as will become apparent from the following discussion.

When the error, identified by Cycle Z, occurs the point at which it occurs within the specific set or sequence of input signals is recorded. Thereafter a Cycle X is established at a point earlier than and considerably prior to Cycle Z.

To identify the first failing cycle a "binary search" algorithm is used. However it is to be understood that any other search methods exist and could also be used. This algorithm comprises the following steps; The functional patterns are applied to the primary inputs and the cycle, Cycle Z, when the failure is indicated at a primary output). Cycle X, the minimum cycle where the failure could occur is now established and Cycle Y is set at (Cycle Z–Cycle X )/2.

The functional patterns are again applied to the primary inputs until Cycle Y is reached at which point the value of all latches in scan chain are dumped and compared to the "expected responses" reached by the use of a "golden" chip or software simulation method previously described. If fail is found, Cycle Z is set to one Cycle Y/2 for the failing cycle is in the first half of the applied functional pattern. If no fail is found, then Cycle X is set equal to Cycle Y for the failing cycle is in the 2nd half of the applied functional pattern.

Functional fail identification and LOAD generation is realized by executing the functional patterns up to the cycle just before the first failing functional clock Cycle Z and switching to the LSSD mode to unload the registers in the scan chain is performed for both L1 and L2 latches via "skewed" unload scan clocking known to the prior art. The values of the Primary Inputs and the Primary Outputs, including transitions are recorded along with the functional clocking sequence and generating the LSSD load by loading the initial and final states for each latch and Primary Input.

Also, at this time, the system clock is inhibited and the functional test reinitiated and reapplied until a cycle, e.g., cycle 120,000 just prior to the failing cycle 121,000 is reached. The test is now shifted to the LSSD Scan mode and all the registers 62, 63, 64, 65 and 66, are dumped or unloaded by an unload clocking step or cycle as indicated in step 83 of FIG. 3. The information thus dumped from the registers 62, 63, 64, 65 and 66 during cycle # 120,999, includes both the L1 and the L2 latches. Normally the scan operation consists of alternating LSSD "A" and "B" clocks and one A/B clock pair scan operation for each latch in the scan chain but for a "skewed launch", the LSSD "B" clock pulse for the last scan operation is not applied during the scan operation instead it is applied during the "launch/capture cycle" just before the LSSD "C" clock capture.

Simultaneously, the values of the Primary Inputs and the Primary Outputs as well as any transitions is recorded along with the functional clocking sequence and any detected values different from those expected.

The necessary LSSD LOAD information, in the form of LSSD data, is now generated by loading the initial and the final state for each latch in each register and each Primary Input. These steps are illustrated as step 84 of FIG. 3.

The generated LOAD information, is now combined into a structural LSSD tester loop or pattern, using known prior art techniques and applied to a known good or reference chip, as shown in step 85, so that the output, i.e., the scan chain and the contents of all the latches in the Known good or reference chip, is a unloaded as shown in step 86 in FIG. 3, to generate a deterministic LSSD pattern, shown as step 87, and is set forth in greater detail in the following example.

As noted previously, the structural circuit shown in FIG. 2 is an example for the proposed diagnostic process. The figure represents a portion of a functional circuit, designed according to LSSD rules, that consists of some Primary Inputs (PIs) and Primary outputs (POs), a 16:1 decoder, five registers 62, 63, 64, 65, and 66 of various lengths and some random "glue" logic that are concatenated into a single scan chain accessed via the scan-in and scan-out I/Os. It was also assumed a fault F exist in the combinational logic that controls the four select lines of the decoder via Reg. 64 that, during functional testing, introduces an error that eventually propagates to some Primary Outputs and register latches. When this occurs the circuit in question must be determined and the error diagnosed.

Preferably, the diagnostic process is as follows:

The first functional failing cycle (internal) is identified by the following "binary search" algorithm. It should be noted that other search methods known to the art could also be used (Step 81 of FIG. 3) The established functional patterns are now applied to the circuit under test and the cycle at which the functional patterns fail (at a primary output) is recorded. This is the maximum cycle, i.e., Cycle Z, that the failure could occur. Cycle X is set to 0. (Cycle X is the minimum cycle at which the failure could occur.) Set "Cycle Y" to (Z−X)/2 and apply the established functional patterns up to "Cycle Y". When Cycle Y is reached, the value of all latches in the scan chain is dumped and compared to the "expected responses" (method described below). If fail is found, set Z to Y/2 (this means the failing cycle is in the first half of the functional pattern set) If no fail is found, then set X to Y. (This means that the failing cycle is in the 2nd half of the functional test set.)

Apply functional patterns up to "Cycle X". Dump the values of all latches in the scan chain. If a fail is found, the "first failing functional clock cycle (internal)" is X. If no fail is found, the "first failing functional clock cycle (internal)" is Z.

Once all the input conditions, internal state, clocking sequence, and expected "good" device data is known, any number of prior art structural diagnostic pattern can be constructed to detect the fault F.

The whole process can be repeated for multiple failing functional patterns if higher diagnostic resolution is required. Furthermore, the concept can be further extended to some AC diagnostics with proper timing considerations.

This generated LSSD pattern is then applied to the previously failed chip and the failing data recorded as shown by step 88 of FIG. 3. This failing data is now diagnosed (step 89) for deterministic fails as taught.

Thus the present invention is directed to a method of diagnosing failing circuits encountered during functional testing of a complex LSSD circuit and for diagnosing the failure mode of those devices which have failed to pass by combining deterministic and functional testing and diagnostic techniques and allows for a systematic diagnostic methodology based on design structure rather than functional behavior, thereby reducing turn-around-time and fault localization accuracy and resolution.

The present invention especially accomplishes this by transforming a functional pattern into a scan deterministic pattern so that existing diagnostic tools can also be used without impacting manufacturing test and broadly comprises a method of testing that includes the steps; of identifying the failing vector of the functional test; observing the states of the failed device by unloading the values of the latches from the LSSD scan chain before the failing vector which may also include reading the embedded circuit memories and other circuit storage elements; generating a Load from the unloaded states of the latches: applying the generated Load which as the first event of a newly created independent LSSD deterministic pattern using the same identical primary inputs and Clocks that produced the failure to known correctly operating device using the bootstrapping technique and unloading the output of the correctly operating device to generate a deterministic LSSD pattern; and operating the generated deterministic LSSD pattern to the failing device and diagnosing the failure using existing LSSD deterministic tools.

It should be clearly understood that although the invention was particularly described with reference to LSSD patterns that one skilled in the art will understand that the present invention is also applicable to GSD patterns.

Still further, it is to be understood that the present invention is also applicable to multiple sets of patterns as well as only a single pattern.

This completes the description of the preferred embodiment of the invention. Since changes may be made in the above process without departing from the scope of the invention described herein, it is intended that all the matter contained in the above description or shown in the accompanying drawings shall be interpreted in an illustrative and not in a limiting sense. Thus other alternatives and modifications will now become apparent to those skilled in the art without departing from the spirit and scope of the invention as set forth in the following claims.

What is claimed is:

1. A method of diagnosing a failure in a complex semiconductor device comprising the steps of:
   selecting a semiconductor device having logic circuits formed of latches;
   selecting a functional test procedure;
   testing the logic circuits in the device with said functional test procedure and upon identifying a failing vector in said device;
   selecting a structural design and test technique;
   combining said functional test procedure and said structural design and test technique to dynamically create a new test pattern based on the functionally identified failure; and
   transforming said new test pattern into a scan deterministic pattern; and
   diagnosing the failing circuit with said scan deterministic pattern to determine the location of and, type of error in said failing circuit.

2. The method of claim 1, wherein the failing logic circuit is diagnosed as stuck at zero.

3. The method of claim 2, wherein the failing logic circuit is diagnosed as stuck at one.

4. The method of claim 2, wherein the failing logic circuit is diagnosed as having AC faults.

5. The method of claim 2, wherein the failing circuit is diagnosed as having transitional faults.

* * * * *